(12) United States Patent
Yung et al.

(10) Patent No.: US 10,791,658 B2
(45) Date of Patent: Sep. 29, 2020

(54) LOW NOISE AMPLIFIER SHIELD

(71) Applicant: Hughes Network Systems, LLC, Germantown, MD (US)

(72) Inventors: Yu Yung, Germantown, MD (US); Rajesh Joshi, Clarksburg, MD (US)

(73) Assignee: Hughes Network Systems, LLC, Germantown, MD (US)

( * ) Notice: Subject to any disclaimer, the term of this patent is extended or adjusted under 35 U.S.C. 154(b) by 32 days.

(21) Appl. No.: 16/119,355

(22) Filed: Aug. 31, 2018

(65) Prior Publication Data
US 2020/0077546 A1    Mar. 5, 2020

(51) Int. Cl.
| | |
|---|---|
| H05K 9/00 | (2006.01) |
| H03F 1/26 | (2006.01) |
| H05K 1/18 | (2006.01) |
| H05K 1/02 | (2006.01) |
| H03F 3/195 | (2006.01) |

(52) U.S. Cl.
CPC .............. *H05K 9/0024* (2013.01); *H03F 1/26* (2013.01); *H03F 3/195* (2013.01); *H05K 1/0216* (2013.01); *H05K 1/181* (2013.01); *H05K 9/0084* (2013.01); *H03F 2200/294* (2013.01); *H03F 2200/451* (2013.01); *H05K 2201/10371* (2013.01)

(58) Field of Classification Search
CPC ..................................................... H05K 9/0024
See application file for complete search history.

(56) References Cited

U.S. PATENT DOCUMENTS

| | | | | |
|---|---|---|---|---|
| 5,566,055 A | * | 10/1996 | Salvi, Jr. ............... | H05K 9/0037 361/816 |
| 2010/0285636 A1 | * | 11/2010 | Chen ..................... | H01L 21/561 438/113 |
| 2014/0092578 A1 | * | 4/2014 | Kwon ................... | H04B 15/04 361/818 |

* cited by examiner

*Primary Examiner* — Hung V Ngo
(74) *Attorney, Agent, or Firm* — Bejin Bieneman PLC

(57) ABSTRACT

A system includes a shield for a low noise amplifier. The shield includes a top and one or more walls extending from the top defining a cavity. The shield further comprises at least one conducting member extending outwardly from the top and within the cavity. The shield may enclose an amplifier circuit and improve its signal-to-noise ratio.

15 Claims, 8 Drawing Sheets

LOW NOISE AMPLIFIER SHIELD

BACKGROUND

Faraday cages or shields can be used to protect a radio receiver input stage or other sensitive amplifier from picking up electromagnetic interference at the amplifier input.

DETAILED DESCRIPTION

In a radio-frequency receiver, a shield, formed of metal, can be placed over the low noise amplifier, forming a cavity in which the low noise amplifier operates. Within the cavity, some signal energy of the signal of interest radiates from the low noise amplifier and can be lost. Recapturing some of the energy radiated from the amplifier can improve a noise figure (NF) of the low noise amplifier. As used herein, the noise figure of the amplifier is a measure of the degradation of the signal-to-noise ratio (SNR) caused by the amplifier. A lower noise figure indicates improved performance of the amplifier. As described in additional detail below, adding one or more conducting members into the cavity formed by the shield can improve the recapture of signal energy radiated by the low noise amplifier, reducing the noise figure of the low noise amplifier.

Figure 1:
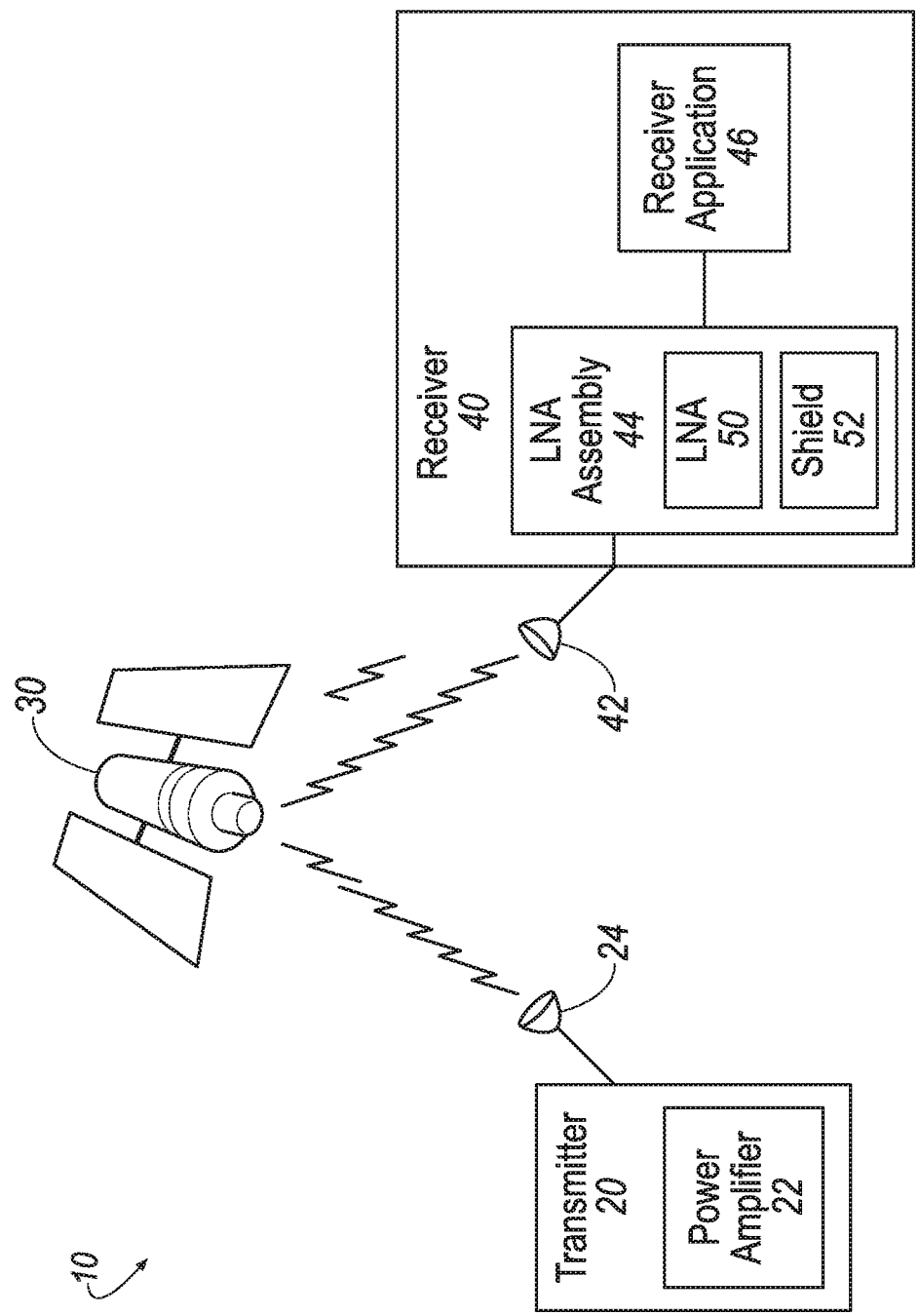
FIG. 1 is a block diagram of an exemplary radio-frequency communications system.

As shown in FIG. 1, an example radio-frequency communications system 10 includes a transmitter 20, a satellite 30 and a receiver 40. Various types of communications may be provided over the radio-frequency communications system 10, e.g., Internet or other packet network access, telephone communications, Voice over IP (VoIP), audio and video transmissions, communications related to guidance systems, etc. In at least some examples, the radio-frequency communications system 10 can operate in a microwave band or millimeter wave band. The microwave band includes a frequency range from 3 to 30 gigahertz (GHz) corresponding to a range of wavelengths from approximately 100 to 10 millimeters, respectively. The millimeter band includes a range of frequencies from 30 to 300 gigahertz (GHz) corresponding to a range of wavelengths from 10 to 1 millimeters, respectively.

The transmitter 20 is an electronic system including an electronic power amplifier circuit 22 operable to transmit radio-frequency signals. The transmitter 20 receives an input signal, increases the power level in the electronic power amplifier circuit 22 and transmits an outbound signal via one or more antennas 24. The antenna 24 is an array of conductors that operates as a transducer between the electronic power amplifier circuit 22 and radio waves propagating through space. In an example, the transmitter 20 transmits the outbound signal via the antenna 24 to the satellite 30. In other examples, the transmitter 20 may transmit the outbound signal via the antenna 24 to a ground-based receiver.

The satellite 30 is operable to receive and retransmit radio-frequency communications and includes a radio-frequency relay station. The satellite 30 receives outbound signals from the transmitter 20 and retransmits the outbound signal to the receiver 40.

The receiver 40 includes an antenna 42, a low noise amplifier assembly 44 and a receiver application 46. The antenna 42 comprises an array of conductors that receives the outbound radio-frequency signal from the satellite 30 and outputs an output signal to the low noise amplifier assembly 44 based on the outbound signal. The low noise amplifier assembly 44 receives the output signal from the antenna 42. Based on the output signal, the low noise amplifier assembly 44 generates and outputs an amplified and filtered version of the output signal to the receiver application 46. As used herein, the receiver application 46 is an electronic system or sub-system that utilizes data from a radio-frequency signal received by the low noise amplifier assembly 44 to perform operations, such as signal processing operations. Non-limiting examples of receiver applications include a network, media or data application such as a local area network (LAN), a wide area network (WAN), a router, a Wi-Fi hotspot, one or more computers, one or more set top boxes, a digital telephone system, etc.

The low noise amplifier assembly 44 includes a low noise amplifier 50 and a shield 52. The low noise amplifier 50 is an electronic circuit that generates an amplified output signal of at least a portion of the outbound signal received from the antenna 42. The shield 52 comprises a metal structure placed over the low noise amplifier 50 such that the low noise amplifier 50 is shielded from electromagnetic disturbances (e.g., interfering radio-frequency signals) in the environment of the receiver 40. As described in additional detail below, the shield 52 includes one or more conducting members 74 (see FIG. 3A) within a cavity formed by the shield 52. The shield 52 including the one or more conducting members 74 can form a combination of electrical conductors and magnetic conductors positioned relative to the low noise amplifier 50. In the context of the present disclosure, electrical conductors are portions of material (typically a metal) that have a high electrical conductivity. In the context of this disclosure, $0.5 \times 10^7$ Siemens per meter at 20 degrees Centigrade can be considered a high electrical conductivity. Further in the context of the present disclosure, magnetic conductors are the high impedance areas that are formed by spacing the inner surface 71 of the top 70 of the shield 52 a quarter guided wavelength away from ends 79 of the conducting members 74 (see FIGS. 3C and 3D). A high impedance area can be understood in the context of this disclosure, to be an area that blocks most or all radiation in the frequency range of interest. Accordingly, the combination of electrical conductors and magnetic conductors can stop or reduce the propagation of the radiated electromagnetic energy on the shield 52, which can improve the noise figure of the low noise amplifier 50 by increasing the recapture of signal energy of a signal of interest by the low noise amplifier 50 through reflection within the cavity.

Figure 2:
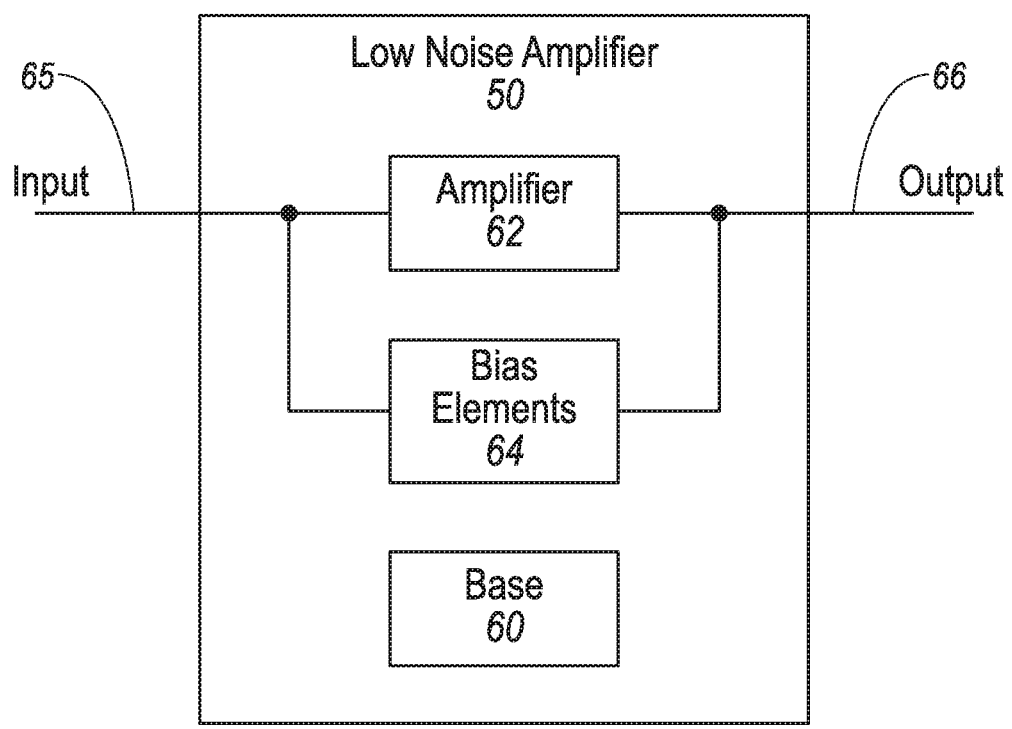
FIG. 2 is a block diagram of an example low noise amplifier assembly.

FIG. 2 is a block diagram of an example low noise amplifier 50. The low noise amplifier 50 is an electronic, radio-frequency amplifier circuit that includes a base 60, one or more amplifiers 62, one or more bias elements 64, an input 65 and an output 66.

The base 60 is typically a printed circuit board or other suitable substrate (e.g., such as a ceramic substrate or semiconductor material such as silicon) that supports the radio-frequency amplifier circuit. According to one non-limiting example, the amplifier circuit comprises one or more amplifiers 62 and one or more bias elements 64 (e.g., on an upper surface 61—shown in FIGS. 4A-4B). Electrical nodes, such as metal traces, may be included on the base 60 to electrically couple the one or more amplifiers 62 and one or more bias elements 64 to one another. In at least one example, the one or more amplifiers 62 and one or more bias elements 64 are partially or fully formed on and/or within the base 60.

Returning to FIG. 2, amplifier 62 comprises one or more active electronic components such as a bi-polar transistor, metal-oxide-semiconductor field-effect transistor (MOSFET), etc. The amplifier 62 may also include one or more electronic circuits such as an integrated operational amplifier.

The bias elements 64 can include electronic components such as resistors, capacitors, diodes, Zener diodes, etc. The bias elements 64 can be used to bias the amplifier 62, for example, within a linear range of operation, and/or to set corner frequencies for filter functions that may be performed by the low noise amplifier 50. For example, the low noise amplifier 50 may be configured as a band pass filter operable to attenuate signals at frequencies outside of the frequency range of interest. Non-limiting examples of the frequency ranges of interest include ranges from 17.8 to 20.2 GHz. The frequency ranges of interest can be any range of frequencies within the microwave and millimeter wave bandwidths, i.e. between 3 GHz and 300 GHz.

The bias elements 64 are shown in FIG. 2 to be in parallel to the amplifier 62. The bias elements 64 may, however, be coupled in other configurations within the low noise amplifier 50. The one or more bias elements 64 may be coupled in between the input 65 and the amplifier 62, in between the amplifier 62 and the output 66, in between the input 65 and ground, in between the input 65 and a positive supply potential, etc. The bias elements 64 can be used, for example, as feedback elements from the output 66 to the input 65 to bias the amplifier 62—e.g., in a linear range of operation. The bias elements 64 may further be used to set corner frequencies for filter functions that may be performed by the low noise amplifier 50. For example, the low noise amplifier 50 may be configured as a band pass filter operable to attenuate signals at frequencies outside of the frequency range of interest.

The input 65 is an electrical node coupled to an input of the amplifier either directly, or through a bias element 64. The input 65 may further be coupled to one or more bias elements 64. The input 65 may be formed, for example, as a metal trace on the base.

The output 66 is an electrical node coupled either directly, or via a bias element 64, to an output of the amplifier 62. The output 66 may further be coupled to one or more bias elements 64. The output 66 may be formed, for example, as a metal trace on the base.

Turning now to FIGS. 3A-3D, these figures illustrate an example shield 52 which may be adapted to cover the low noise amplifier 50 described above. The shield 52 may be formed of metal, another highly conductive material or a plastic material coated by an electrically conducting thin film, and typically is attached to or abuts to the base 60 supporting the low noise amplifier 50. The shield 52 may be rectangular and includes a top 70 and first, second, third and fourth walls 72a, 72b, 72c, 72d (collectively walls 72). The walls 72 extend from the top 70 to an end 81. In at least one example, a length (hw) of each of the first, second, third and fourth walls 72a, 72b, 72c and 72d are the same and a surface 83 at end 81 is approximately parallel to the top 70. However, this is not required in all examples. The shield 52 is open on a side opposite the top 70.

The top 70 includes an inner surface 71. The first, second, third and fourth walls 72a, 72b, 72c and 72d include respective inner surfaces 73a, 73b, 73c, 73d (collectively inner surfaces 73). The inner surface 71 of the top 70, together with the inner surfaces 73 of the walls 72, define a cavity 76. The shield 52 further includes first and second conducting members 74a, 74b (collectively conducting members 74). The two conducting members 74 may extend outwardly from the inner surface 71 of the top 70 into the cavity 76 (e.g., in a direction perpendicular from the inner surface 71). As described more below, each conducting member 74 may be spaced from one another and spaced from each of the walls 72. In an example, the first and second conducting members 74a, 74b have a substantially same length, though this need not always be so.

Other configurations of the shield 52 are possible. For example, the shield 52 may have a cylindrical shape (e.g., top 70 may be circular and wall 72 may be cylindrical). As another example, the shield 52 may be dome shaped; e.g., the top 72 may be concavely-curved and one or more walls 72 may extend therefrom. Other suitable shapes also are contemplated herein.

Figure 3A:
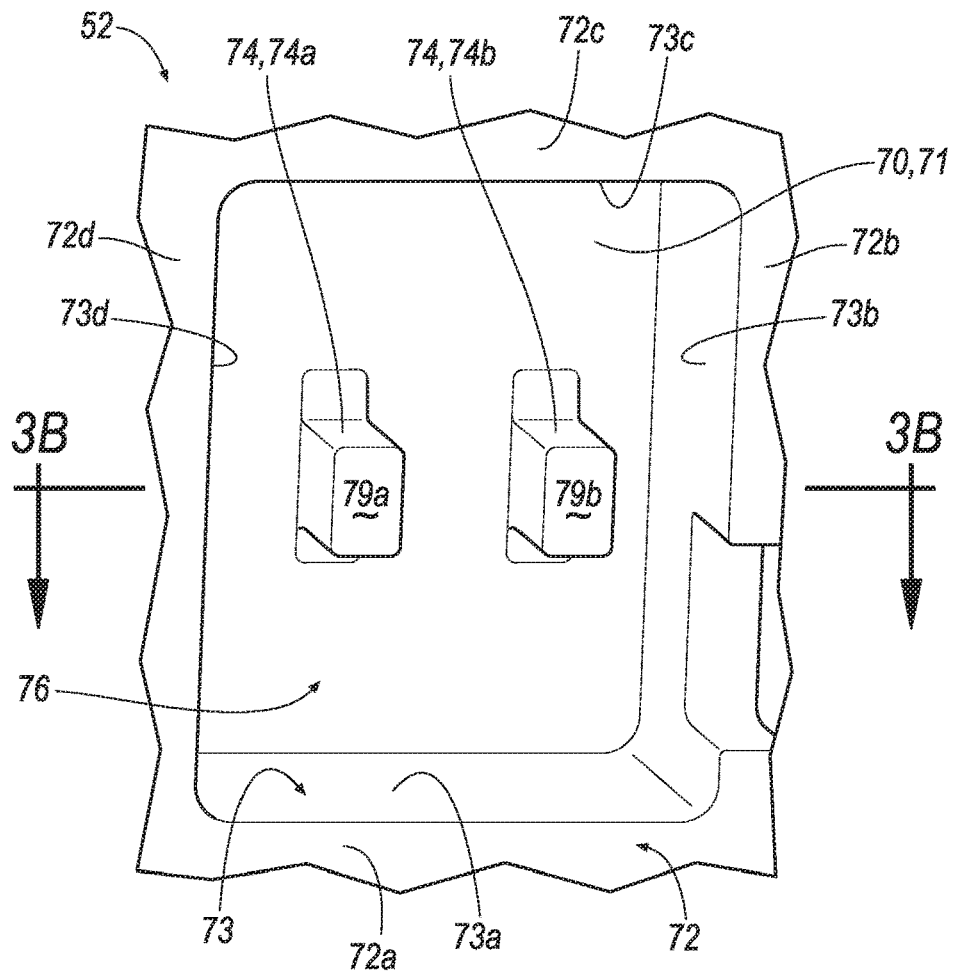
FIG. 3A is a perspective view of an inside of an example shield for a low noise amplifier assembly.
Figure 3B:
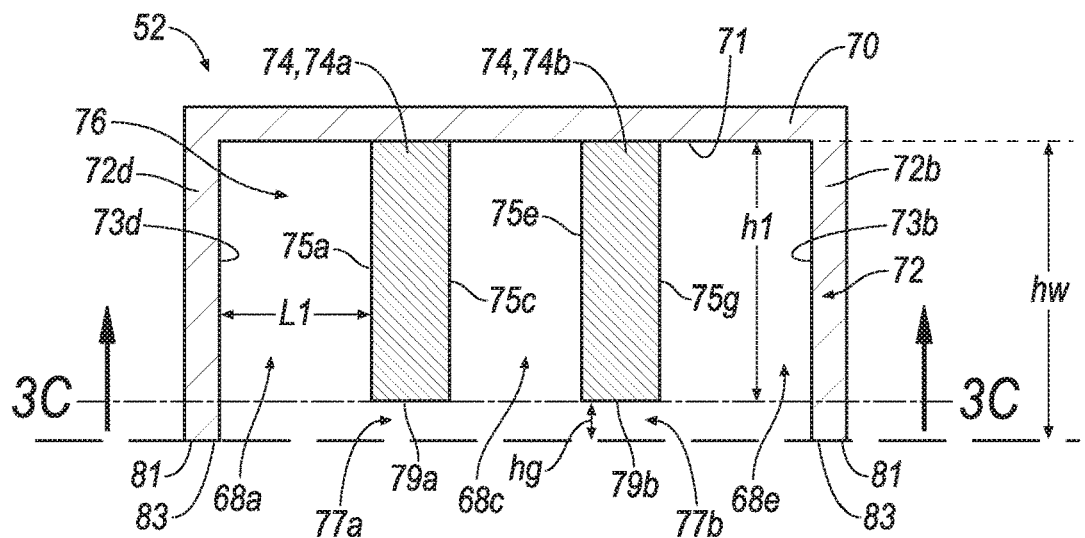
FIG. 3B is a side view of a section of the example shield of FIG. 3A, cut along a line 3B-3B.

FIG. 3B is a sectional side view of the shield 52, cut along the line 3B-3B as shown in FIG. 3A. In at least one example (and while not required), each conducting member 74a, 74b may be identical; therefore, only one (74a) will be described. According to one example, conducting member 74a may have a rectangular geometry—e.g., four sides 75a, 75b, 75c, 75d may extend into cavity 76 from surface 71, terminating at a distal end 79a (see also the sectional bottom view of FIG. 3C). Similarly, conducting member 74b may comprise sides 75e, 75f, 75g, 75h, terminating at distal end 79b.

Conducting member 74a may have a length (h1), wherein h1 is defined as a distance between surface 71 and end 79a. Further, length (h1) may be shorter than length (hw) of the walls 72a, 72b, 72c, 72d. In this manner, when shield 52 is abutted to the base 60, an air gap 77 exists (having a span (hg)). The air gap 77 may be defined by a difference of two lengths (e.g., air gap 77 (hg)=hw−h1). The air gap 77 can improve recapture of the signal of interest during operation of the low noise amplifier 50. The narrower the air gap 77 is, the wider the frequency range that will be blocked or partially blocked from radiation through the shield 52. Reducing the air gap 77 lowers the cutoff frequency of a waveguide dominant mode, increases the cutoff frequency of a waveguide $1^{st}$ higher order mode and hence extends the frequency range of the waveguide single mode operation. The waveguide dominant mode is the mode with the lowest cutoff frequency. The waveguide $1^{st}$ order mode is the mode with the second lowest cutoff frequency. Conversely, increasing the air gap 77 increases the cutoff frequency of the waveguide dominant mode, lowers the cutoff frequency of the waveguide $1^{st}$ higher order mode and hence reduces the frequency range of the waveguide single mode operation.

The conducting member 74a may extend from surface 71 at any suitable angle (e.g., the extending outwardly normal with respect to surface 71 is merely an example and not intended to be limiting). Further, conducting member 74a may have a variety of cross sections. For example, the cross section of conducting member 74a may be rectangular, round, oval shaped, or a combination thereof. Further, conducting member 74a may be straight, curved or have multiple angular sections. In another example, the conducting member 74a may extend outwardly from one or more walls 72 of the shield 52 into the cavity 76. Thus, the illustrated shield 52 (having two conducting members 74a, 74b) is only an example. For instance, the shield 52 can include any number of conducting members 74 (e.g., one or more than two). Any of these implementations may be used with one another in any suitable combination.

In an example, the top 70, the walls 72 and the conducting members 74 may be formed of a single, unitary piece of metal (e.g., in a mold or the like), or a single piece of plastic and coated with a metallic film. In another example, the shield 52 may be formed of multiple pieces. For example, the top 70 and walls 72 may be a first piece of unitary construction. Each of the conducting members 74 may be formed separately and attached to the top 70 of the first piece. A non-limiting list of materials that can be used to form the shield 52 include gold, silver, copper, aluminum, zinc and plastic materials coated by a metallic thin film. The conductivity of the metal can be selected to be greater than a minimum conductivity threshold. For example, the minimum conductivity threshold can be selected to be $0.5 \times 10^7$ Siemens per meter at 20 degrees Centigrade. As will be apparent from the description below, the higher the conductivity of the metal used to form the shield 52, the higher the impedance of the magnetic conductors (MCs) to the frequency range of interest that can be formed at a plane a quarter or approximately a quarter guided wavelength away from the inner surface 71 of the top 70 of the shield 52. The plane of the magnetic conductors (MCs) extends parallel to the inner surface 71 of the top 70 of the shield 52, along the ends 79 of the conducting members 74 and between the inner surfaces 73 of the walls 72 (See FIGS. 3B and 3C). In at least one example, the shield 52 comprises a mesh or woven structure.

Turning again to FIG. 3C, during operation of the low noise amplifier 50, the end surface areas 79a and 79b of the conducting members 74a, 74b, behave as electrical conductors (ECs) and the open surface areas of the volumetric regions 68a, 68b, 68c, 68d, 68e, 68f 68g (collectively volumetric regions 68) along the plane extending parallel to the inner surface 71 of the top 70 of the shield 52 at a level corresponding to the end surface areas 79 of the conducting members 74 behave as magnetic conductors (MCs). As used herein, a volumetric region is a three-dimensional space within cavity 76 defined by at least a portion of one wall 72, at least a portion of the top 70, and at least a portion of one conducting member 74. Examples of volumetric regions 68a, 68b, 68c, 68d, 68e, 68f, 68g are shown in Table 1 and FIGS. 3C-3D.

TABLE 1

| Volumetric Region | $1^{st}$ Side | $2^{nd}$ Side | $3^{rd}$ Side | width | height |
|---|---|---|---|---|---|
| 68a | 73d | 71 | 75a | L1 | h1 |
| 68b | 73a | 71 | 75b | d2 | h1 |
| 68c | 75c | 71 | 75e | L2 | h1 |
| 68d | 73a | 71 | 75f | d2 | h1 |
| 68e | 75g | 71 | 73b | L3 | h1 |
| 68f | 75h | 71 | 73c | d1 | h1 |
| 68g | 75d | 71 | 73c | d1 | h1 |

As described below, the volumetric regions 68 can be dimensioned, for example, by selecting the size and shape of the top 70 and walls 72, as well as by selecting the size, shape, quantity and placement of the conducting members 74, to thereby form magnetic conductors (MC) for the frequency range of interest of the low noise amplifier 50. According to at least one design criteria, a magnetic conductor (MC) may be based on the guided wavelengths at the center frequency in the frequency range of interest. As will be described more below, the anticipated size of a guided wavelength may be used to design the size and shapes of the features of the shield 52—e.g., so that propagation of the signal on the shield is stopped or reduced and a portion or all of the signal can be reflected back to the low noise amplifier 50 from which the signal emanated.

Figure 3C:
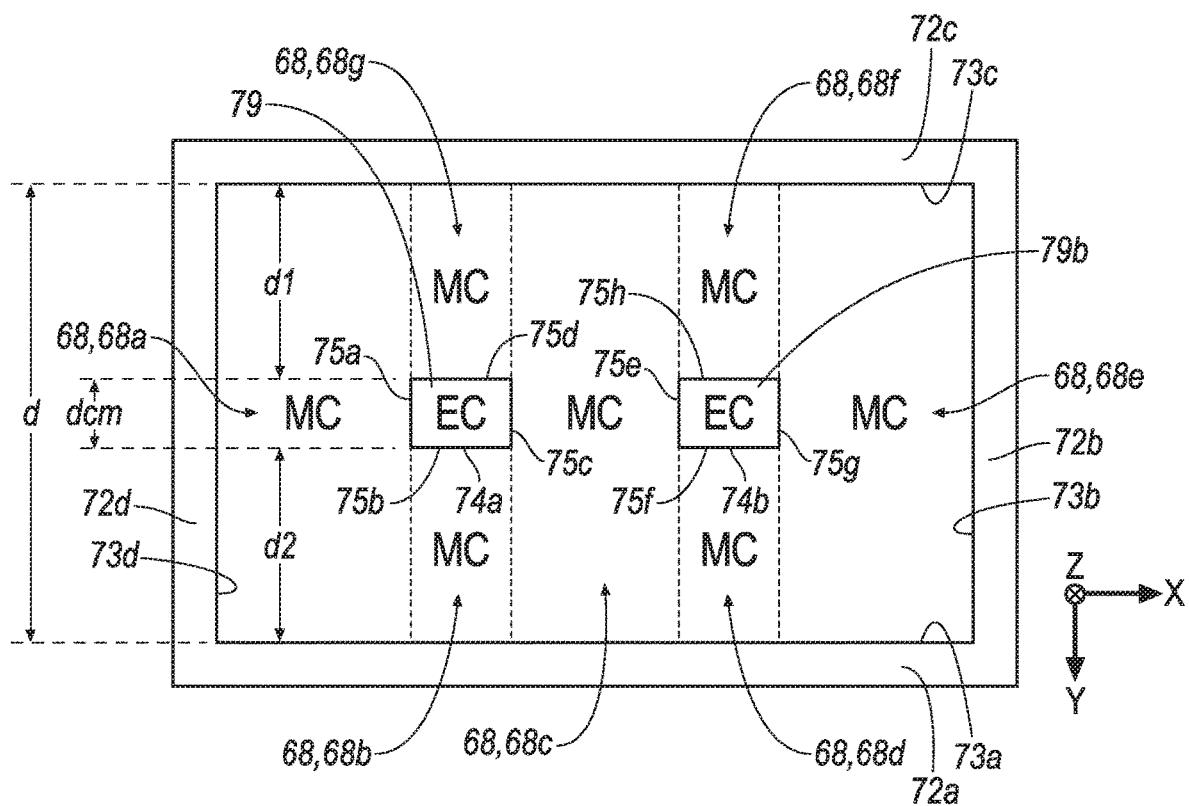
FIG. 3C is a bottom view of the example shield of FIG. 3A, cut along a plane 3C-3C in FIG. 3B.
Figure 3D:
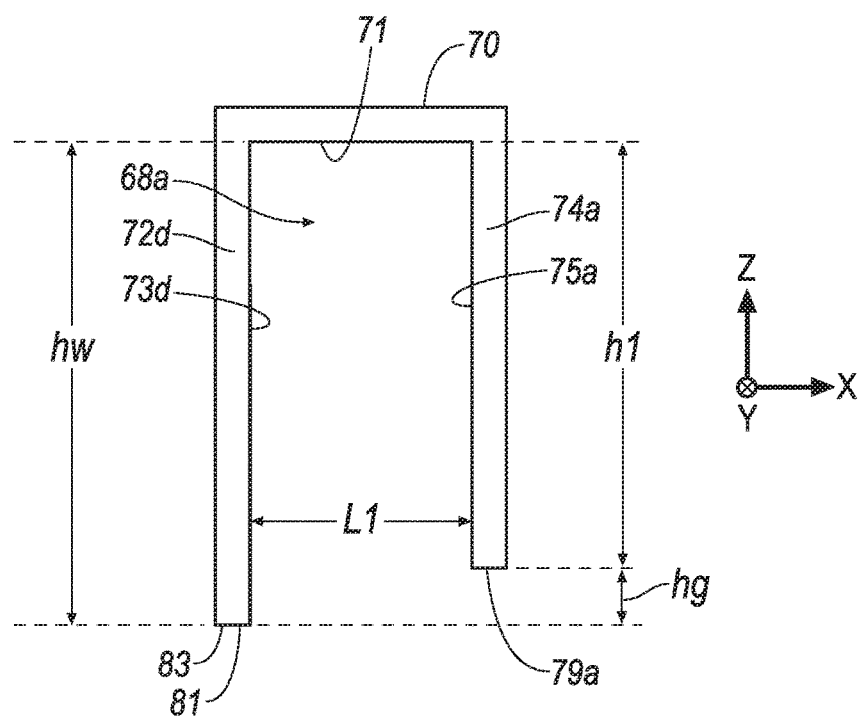
FIG. 3D is a side view of an example volumetric region forming a magnetic conductor.

By way of example (and for purposes of explanation), FIGS. 3C and 3D illustrate the rectangularly-shaped volumetric region 68a bounded by surface 73d (of wall 72d), surface 71 (of top 70), side 75a (of conducting member 74a) and end 79a (of conducting member 74a) (e.g., see cross-hatched region). In this example, volumetric region 68a can be defined by a width L1 (FIG. 3D), a length h1 (FIG. 3D), and a depth d (FIG. 3C). In the figures, depth d is the sum of a depth of a conducting member dcm (e.g., that of 74a), a depth d1 (between side 75d and wall 72c) and a depth d2 (between side 75b and wall 72a).

Using Table 1, other exemplary volumetric regions 68b-68g also may be determined. For example, volumetric region 68b may be bounded by surface 73a (of wall 72a), surface 71 (of top 70), side 75b (of conducting member 74a) and end 79a. Similarly, volumetric region 68c may be bounded by surface 73a, surface 71, surface 73c (of wall 72c), sides 75c and 75e (of conducting members 74a, 74b, respectively) and ends 79a, 79b (respectively). Similarly, volumetric region 68d may be bounded by surface 73a, surface 71, side 75f (of conducting member 74b) and end 79b. Similarly, volumetric region 68e may be bounded by surface 73a, surface 71, surface 73c (of wall 72c), side 75g (of conducting member 74b) and end 79b. Similarly, volumetric region 68f may be bounded by surface 73c, surface 71, side 75h (of conducting member 74b) and end 79b. And similarly, volumetric region 68g may be bounded by surface 73c, surface 71, side 75d (of conducting member 74a) and end 79a. These rectangular volumes are merely examples. In other implementations of shield 52, the quantity and bounds of volumetric regions 68 may differ.

Figure 4A:
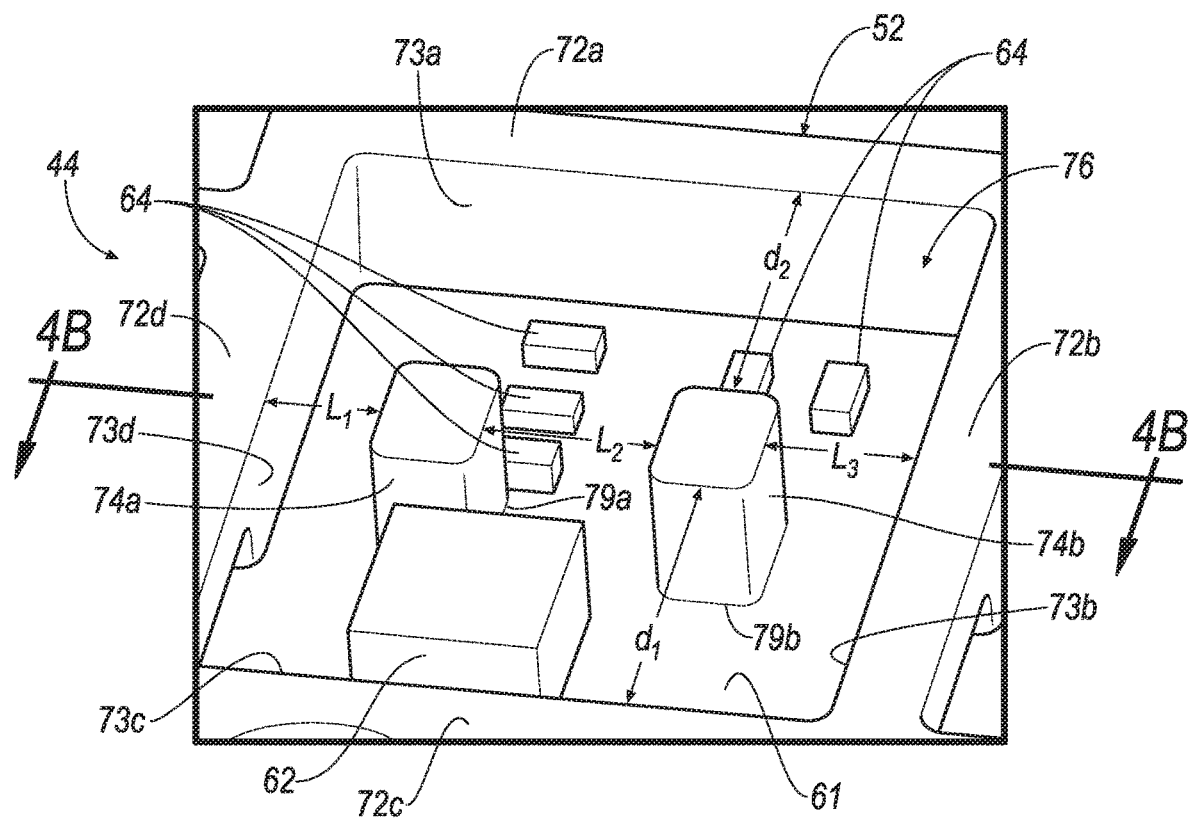
FIG. 4A is a top, perspective view of an example low noise amplifier assembly with a top of the shield removed.
Figure 4B:
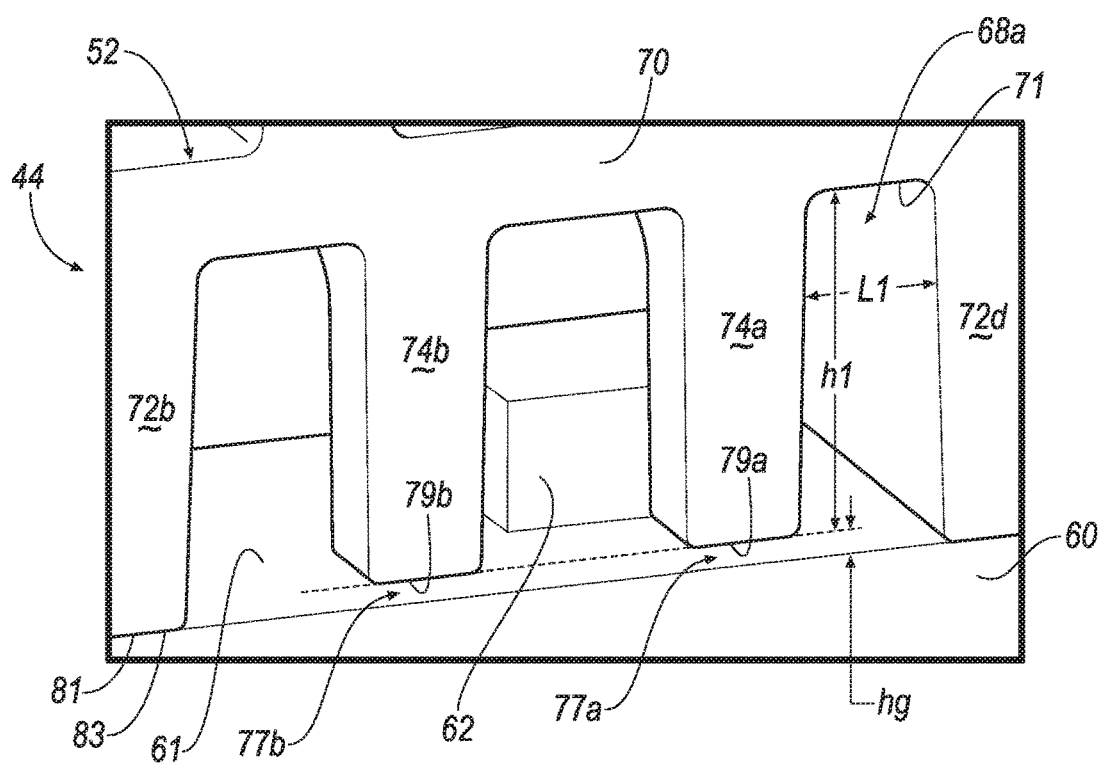
FIG. 4B is a perspective, sectional, side view of the example low noise amplifier assembly of FIG. 4A, cut along a line 4B-4B.

FIGS. 4A-4B illustrate that the spacing between wall 72d and conducting member 74a may be referred to as length L1, the spacing between conducting member 74a and conducting member 74b may be referred to as length L2, and the spacing between wall 72b and conducting member 74b may be referred to as length L3. FIGS. 3C and 4A illustrate that the spacing between 74a and wall 72c and the spacing between 74b and wall 72c may both be depth d1; however, this is not required in all examples. Similarly, FIGS. 3C and 4A illustrate that the spacing between 74a and wall 72a and the spacing between 74b and wall 72a may both be depth d2; however, this is not required in all examples. In at least one example, length h1 is used for all volumetric regions 68; however, this is not required in all examples either.

To assemble the amplifier(s) 62 and bias element(s) 64 may be assembled on the base 60, and the shield 52 may be mounted to the base 60 so that the amplifier(s) 62 and bias element(s) 64 correspond with the position of the cavity 76. The shield 52 may inhibit noise from entering the cavity 76 and interfering with the desired signal received via antenna 42 and input 65. Further, as explained below, the amplifier(s) 62, bias element(s) 64 may radiate signal energy within the shield 52. The shield 52 may be configured so this radiated signal energy (e.g., of the desired signal) may be reflected back into the amplifier(s) 62—thereby improving the signal-to-noise ratio (SNR) at the output 66. The shield 52 may be mounted using any suitable mechanical clips, clamps, glue, solder, weldment, or the like.

According to one example, the dimensions of the volumetric regions 68 may be configured based on a frequency range of interest, and a corresponding guided wavelength ($\lambda_g$). The dimensions of L1, L2, L3, d1 and d2 may be viewed as the rectangular waveguide widths. The determination of the dimensions of L1, L2, L3, d1 and d2 can be based on the waveguide theory, i.e., the widths L1, L2, L3, d1 and d2 should be narrow enough such that the wave propagation in these waveguides in the frequency range of interest is reduced or completely stopped below the waveguide cutoff frequency. The dimension of h1 may be chosen as one fourth of the guided wavelength or $$\frac{\lambda_g}{4}$$

as a design start point. The dimensions of L1, L2, L3, d1, d2 can be selected, for example, to be less than half the wavelength $\lambda_u$ of the upper frequency limit $f_u$ of the frequency range of interest such that propagation is blocked or reduced. The air gap 77 can be selected, e.g., to be a fraction of the wavelength $\lambda_u$ of the upper frequency limit $f_u$ of the frequency range of interest. For the purposes of this disclosure, a fraction of the wavelength $\lambda_u$ means a portion less than one full wavelength $\lambda_u$. In some cases, the portion can be significantly less than one, for example, 0.1. Criteria for dimensioning the air gap 77 are presented above regarding FIGS. 3A-3D. These dimensions may be optimized by using a three dimensional (3D) full wave simulation tool. Examples follow to illustrate how to calculate $\lambda_c$, and $\lambda_g$.

The cutoff wavelength $\lambda_c$ can be selected to be shorter than the wavelength $\lambda_u$ of the upper frequency limit $f_u$ of the frequency range of interest. A guided wavelength ($\lambda_g$) may be calculated using a lower frequency limit $f_l$ of a predetermined frequency range, an upper frequency limit $f_u$ of the predetermined frequency range, waveguide cutoff wavelength $\lambda_c$ and the speed of light (C) in free space. For example, a center frequency $f_0$ can be determined by Equation 1 below. A wavelength $\lambda_0$ at the center frequency may be determined using Equation 2. And the guided wavelength ($\lambda_g$) may be determined using a cut-off wavelength ($\lambda_c$) and Equation 3.

$$f_0 = \frac{f_l + f_u}{2} \qquad \text{Eqn. 1}$$

$$\lambda_0 = \frac{C}{f_0} \qquad \text{Eqn. 2}$$

$$\lambda_g = \frac{\lambda_0}{\sqrt{1 - \left(\frac{\lambda_0}{\lambda_c}\right)^2}} \qquad \text{Eqn. 3}$$

Using the criteria above to determine the values of h1, d1, d2, L1, L2 and L3, the shield 52 is designed to inhibit wave propagation along any horizontal direction on the plane of the combination of electrical conductors (ECs) and magnetic conductors (MCs) as shown in FIG. 3C. Therefore, surface wave propagation on the shield 52 is reduced or eliminated and most or all of the radiated waves of the signal of interest will be reflected back to the low noise amplifier 50. In operation, the signal may propagate from the amplifier(s) 62 and/or bias element(s) 64 from the base 60 toward the top 70 (along the Z-axis), reflect off surface 71 of the shield 52, and return to at least the amplifier(s) 62 (also along the Z-axis)—e.g., entering an input of the amplifier(s) 62 and boosting signal strength (and thus boosting SNR).

Figure 5:
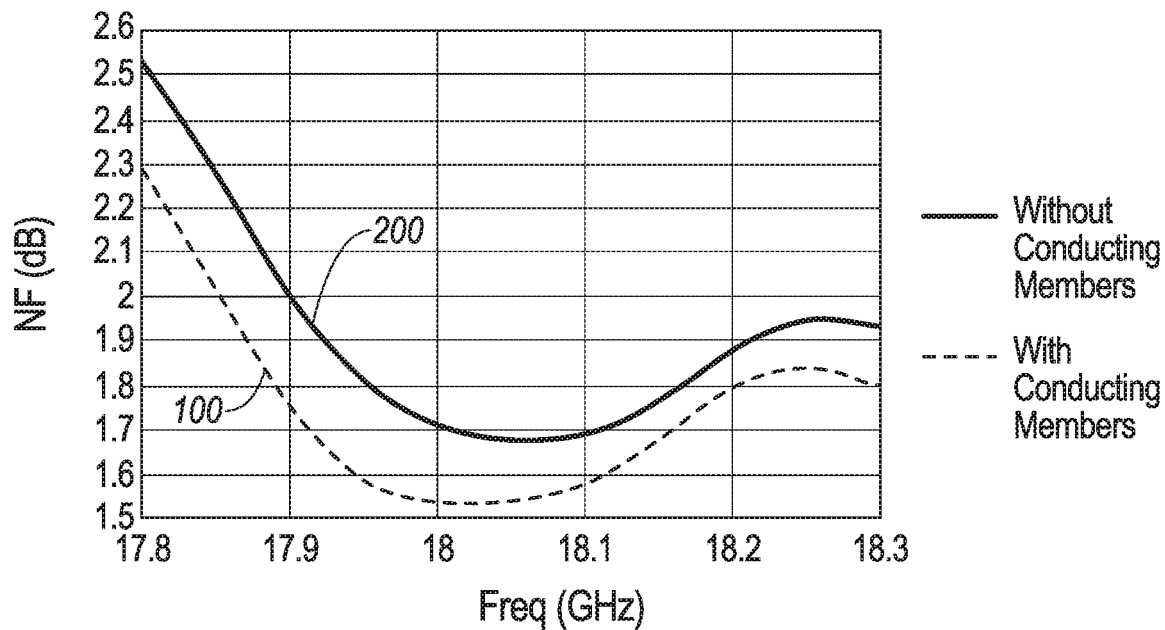
FIG. 5 is a graphical depiction illustrating measured noise factors (NFs) associated with two shields for a low noise amplifier having an input signal from 17.8 to 18.3 GHz, a first shield having a pair of conducting members and a second shield without the conducting members.
Figure 6:
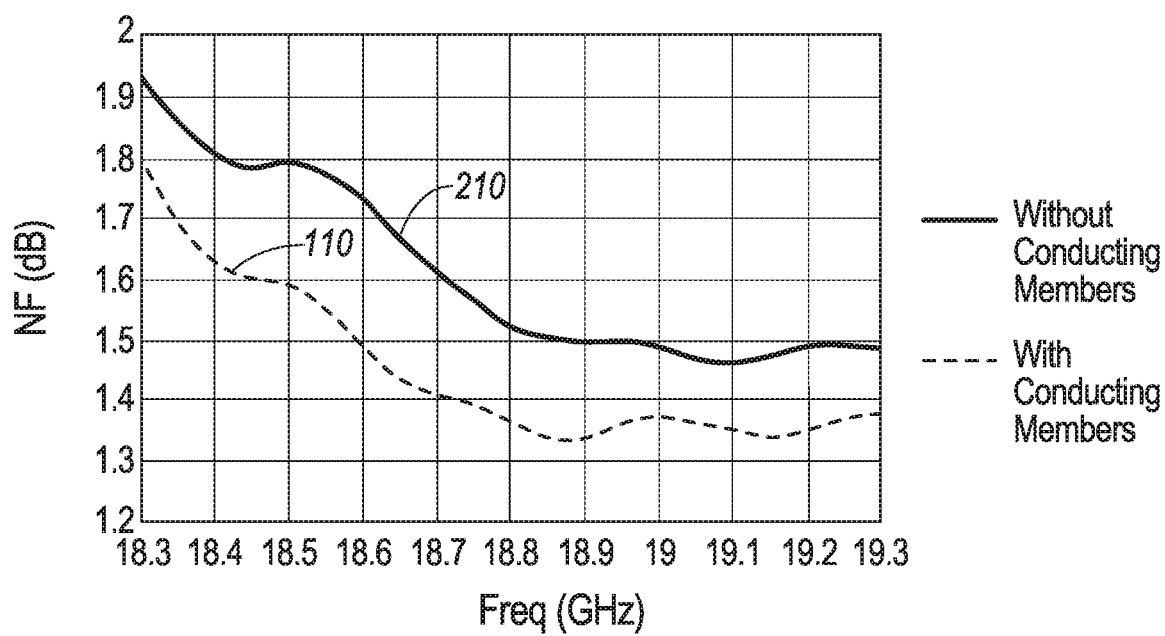
FIG. 6 is a graphical depiction similar to that shown in FIG. 5, except that the input signal is from 18.3 to 19.3 GHz.
Figure 7:
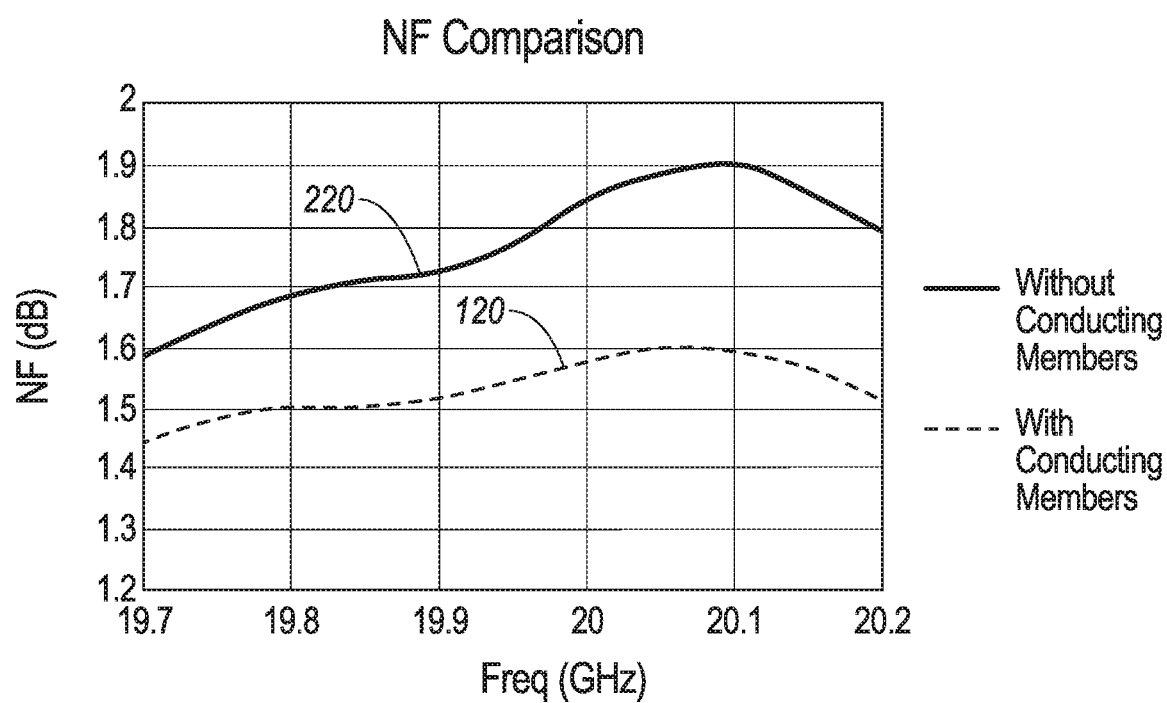
FIG. 7 is a graphical depiction similar to that shown in FIG. 5, except that the input signal is from 19.7 to 20.2 GHz.

Each of FIGS. 5-7 are measurement results of an example low noise amplifier (LNA) assembly 44. Each graph illustrates a measurement result of the LNA assembly 44 with shield 52 (100, 110, 120 in FIGS. 5-7, respectively) and a measurement result with an electromagnetic shield that does not comprise the conducting members 74a, 74b (200, 210, 220 in FIGS. 5-7, respectively). Each plot measures noise figure (NF) against a frequency range of interest. For example, FIG. 5 is a measurement result from 17.8 to 18.3 gigahertz (GHz). FIG. 6 is a measurement result from 18.3 to 19.3 GHz, and FIG. 7 is a measurement result from 19.7 to 20.2 GHz. In each example Band, the noise factor of measurement results 100, 110, 120 are correspondingly lower than those of measurement results 200, 210, 220, respectively. Accordingly, the use of the conducting members 74 in the shield 52 resulted in a noise figure improvement over the full frequency range from 17.8 to 19.3 GHz and 19.7 to 20.2 GHz of 0.1 dB to 0.27 dB. The network throughput, which is the product of the channel bandwidth and the log 2(1+SNR), is increased with the addition of the conducting members 74.

Figure 8:
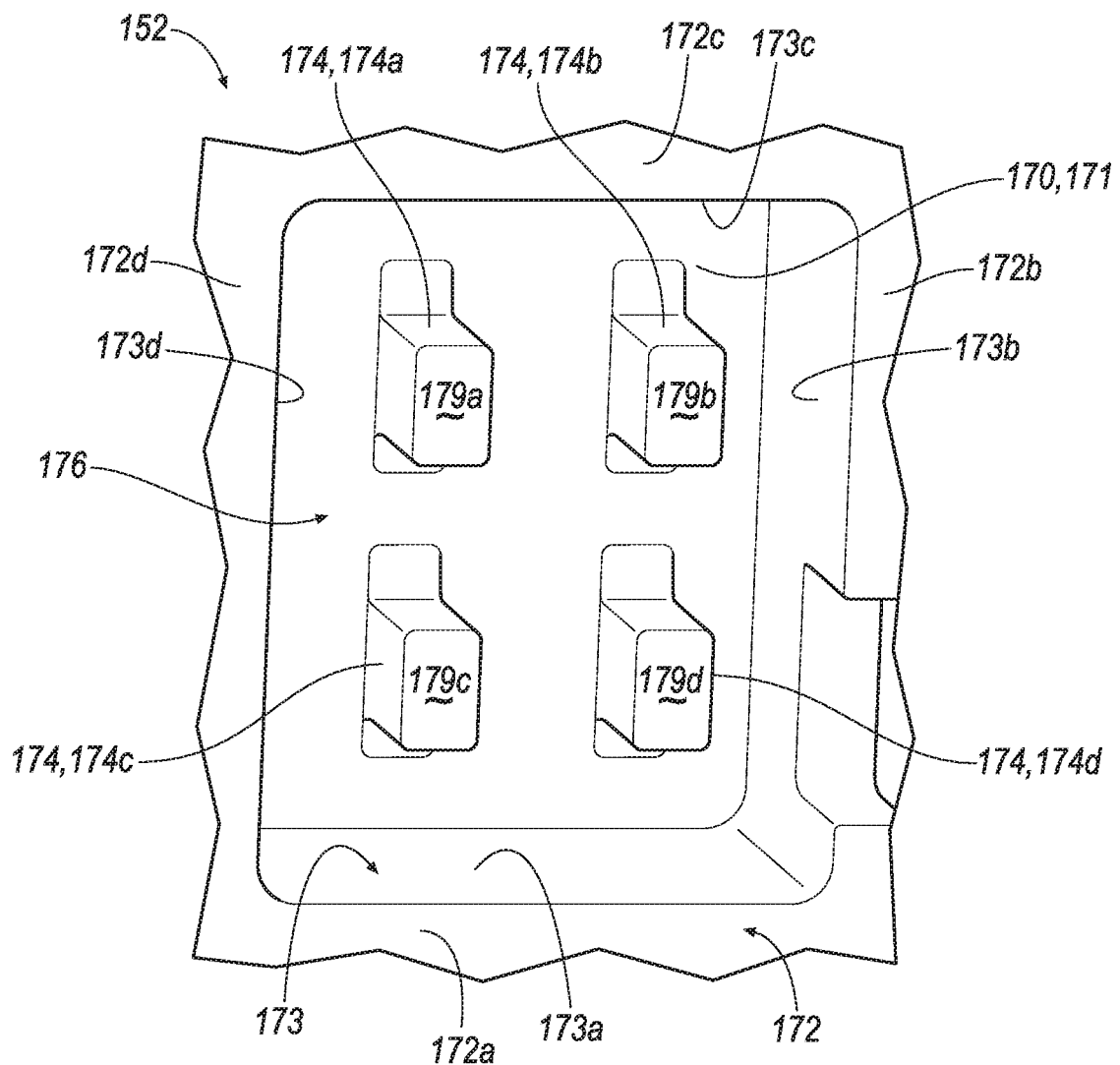
FIG. 8 is a perspective view of an example shield including two rows of conducting members.

FIG. 8 illustrates a second example shield 152. The shield 152 further includes a top 170 including an inner side 171 and four walls 172a, 172b, 172c and 172d including respective inner sides 173a, 173b, 173c and 173d. The top 170 and walls 172 form a cavity 176. The shield 152 includes four conducting members 174a, 174b, 174c, 174d extending from the inner surface 171 of the top 170 into the cavity 176 and arranged in two rows. Other examples of the shield also exist. For example, the shield 52 is not limited to having two conducting members 74 or four conducting members 174. In one example, a single conducting member is used. In another example, three, five or more conducting members may be used. Still other examples may be used.

Thus, there has been described a radio-frequency communications system comprising a radio-frequency receiver having a shield with one or more conducting members. The shield is arranged to cover an amplifier, bias elements, etc. and in operation, the shield limits the propagation of a signal on the shield.

As used herein, the adverb "substantially" modifying an adjective means that a shape, structure, measurement, value, calculation, etc. may deviate from an exact described geometry, distance, measurement, value, calculation, etc., because of imperfections in materials, machining, manufacturing, data collector measurements, computations, processing time, communications time, etc.

With regard to the media, processes, systems, methods, etc. described herein, it should be understood that, although the steps of such processes, etc. have been described as occurring according to a certain ordered sequence, such processes could be practiced with the described steps performed in an order other than the order described herein. It further should be understood that certain steps could be performed simultaneously, that other steps could be added, or that certain steps described herein could be omitted. In other words, the descriptions of systems and/or processes herein are provided for the purpose of illustrating certain embodiments and should in no way be construed so as to limit the disclosed subject matter.

Accordingly, it is to be understood that the present disclosure, including the above description and the accompanying figures and below claims, is intended to be illustrative and not restrictive. Many embodiments and applications other than the examples provided would be apparent to those of skill in the art upon reading the above description. The scope of the invention should be determined, not with reference to the above description, but should instead be determined with reference to claims appended hereto and/or included in a non-provisional patent application based hereon, along with the full scope of equivalents to which such claims are entitled. It is anticipated and intended that future developments will occur in the arts discussed herein, and that the disclosed systems and methods will be incorporated into such future embodiments. In sum, it should be understood that the disclosed subject matter is capable of modification and variation.

The article "a" modifying a noun should be understood as meaning one or more unless stated otherwise, or context requires otherwise. The phrase "based on" encompasses being partly or entirely based on.

What is claimed is:

1. A system for a low noise amplifier, comprising:
the low noise amplifier supported by a base; and
a shield, comprising:
   a top;
   one or more walls extending from the top defining a cavity;
   at least one conducting member extending outwardly from the top and within the cavity and having a distal end; and
   an air gap between the distal end of the at least one conducting member and the base, wherein the shield is located above the base such that at least a portion of the low noise amplifier extends into the cavity.

2. The system of claim 1, wherein the at least one conducting member extends in a direction perpendicular to an inner surface of the top of the shield.

3. The system of claim 1, wherein the shield is formed from one of a metal and a plastic coated by a metallic thin film.

4. The system of claim 3, wherein the metal has a conductivity greater than or equal to 0.5 times $10^7$ Siemens/meter at 20 degrees Centigrade.

5. The system of claim 1, wherein a distal end of the one or more walls abuts the base.

6. The system of claim 1, wherein a span of the air gap (hg) corresponds with a fraction of a guided wavelength of a center frequency within a frequency range of interest of the low noise amplifier.

7. The system of claim 1, wherein the base comprises a printed circuit board.

8. The system of claim 1, wherein the at least one conducting member includes a first conducting member and a second conducting member.

9. The system of claim 8, wherein each of the first conducting member and the second conducting member have substantially a same length.

10. The system of claim 1, wherein a length of the at least one conducting member is based on a guided wavelength of a center frequency in a frequency range of interest for the low noise amplifier.

11. The system of claim 1, wherein a length of the at least one conducting member is at least partially based on a center frequency in a frequency range of interest for the low noise amplifier.

12. The system of claim 1, wherein:
the at least one conducting member includes a first conducting member;
the at least one wall includes a first wall; and
the first conducting member, the first wall and the top of the shield define a volumetric region, wherein an end of the volumetric region, at a plane parallel to an inner surface of the top of the shield, at a level of an end of the first conducting member, forms a magnetic conductor.

13. The system of claim 12, wherein a spacing between the first wall and the first conducting member is based on a wavelength of a lower frequency limit of the low noise amplifier.

14. The system of claim 13, wherein the spacing is lower than the wavelength of a higher frequency limit of the low noise amplifier.

15. The system of claim 12, wherein:
the at least one conducting member includes a second conducting member; and
a spacing between the first conducting member and the second conducting member is based on a wavelength of a lower frequency limit of the low noise amplifier.

* * * * *